US008610288B2

(12) United States Patent
Handa

(10) Patent No.: US 8,610,288 B2
(45) Date of Patent: Dec. 17, 2013

(54) SEMICONDUCTOR DEVICE WITH STACKED SEMICONDUCTOR CHIPS

(75) Inventor: Naohiro Handa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 163 days.

(21) Appl. No.: 12/898,198

(22) Filed: Oct. 5, 2010

(65) Prior Publication Data

US 2011/0260337 A1    Oct. 27, 2011

(30) Foreign Application Priority Data

Apr. 23, 2010 (JP) ................................. 2010-099436

(51) Int. Cl.
*H01L 23/48* (2006.01)

(52) U.S. Cl.
USPC .................... 257/777; 257/686; 257/E23.141

(58) Field of Classification Search
USPC ................... 257/686, 777, E23.141, E23.085
See application file for complete search history.

(56) References Cited

U.S. PATENT DOCUMENTS

| 7,683,485 | B2 | 3/2010 | Nikaido | |
|---|---|---|---|---|
| 2002/0011654 | A1* | 1/2002 | Kimura | 257/686 |
| 2004/0027869 | A1* | 2/2004 | Miwa et al. | 365/199 |
| 2008/0217774 | A1* | 9/2008 | Nikaido | 257/738 |

FOREIGN PATENT DOCUMENTS

| JP | 2001-044229 | 2/2001 |
|---|---|---|
| JP | 2001-044324 | 2/2001 |

* cited by examiner

*Primary Examiner* — Tucker Wright
(74) *Attorney, Agent, or Firm* — Young & Thompson

(57) ABSTRACT

A semiconductor chip 109 is mounted on a substrate 100, first wire group 120 and a second wire group 118 having a wire length shorter than the first wire group are provided so as to connect the substrate 100 and the semiconductor chip 109 to each other, and a sealing resin 307 is injected from the first wire group 120 toward the second wire group 118 so as to form a sealer 401 covering the semiconductor chip 109, the first wire group 120, and the second wire group 118.

21 Claims, 12 Drawing Sheets

SEMICONDUCTOR DEVICE WITH STACKED SEMICONDUCTOR CHIPS

The present application claims the benefit of priority from Japanese Patent Application No. 2010-099436, filed on Apr. 23, 2010, the disclosure of which is incorporated herein in its entirety by reference.

BACKGROUND OF THE INVENTION

1. Field of the Invention

The present invention relates to a method of manufacturing a semiconductor device and a semiconductor device.

2. Description of Related Art

As disclosed in Japanese laid-open patent publications No. 2001-44229 (Patent Document 1) and 2001-44324 (Patent Document 2), methods of manufacturing a ball grid array type (BGA) semiconductor device include a mold array process (MAP), which comprises preparing a substrate having a plurality of product formation portions, mounting semiconductor chips on each of the product formation portions, forming a sealer so that the sealer integrally covers the product formation portions on the substrate, and dividing the substrate into the individual product formation portions.

SUMMARY

However, according to the MAP type method of manufacturing a semiconductor device, a sealing resin is injected from gates along a direction perpendicular to one side of semiconductor chips. Therefore, an entrainment occurs at another side of the semiconductor chips (near air vents) that is opposite to the side from which the resin is injected. Thus, the flow rate of the resin flowing near the air vents is higher than that of the resin flowing on the side from which the resin is injected.

As a result, a wire sweep may occur on wires provided near the air vents due to the pressure of the injected resin. Furthermore, wires may be brought into contact with each other to cause a short circuit.

The present invention seeks to solve one or more of the above problems, or to improve upon those problems at least in part.

In one embodiment, there is provided a method of manufacturing a semiconductor device, the method comprising: (a) mounting a semiconductor chip set comprising at least one semiconductor chip on a substrate; (b) providing a first wire group and a second wire group having a wire length shorter than the first wire group so as to connect the substrate and the at least one semiconductor chip to each other; and (c) injecting a sealing resin from the first wire group toward the second wire group so as to form a sealer covering the at least one semiconductor chip, the first wire group, and the second wire group.

In another embodiment, there is provided a semiconductor device comprising: a substrate; a semiconductor chip set including at least one semiconductor chip mounted on the substrate; a first wire group and a second wire group provided so as to connect the substrate and the semiconductor chip set to each other, the second wire group having a wire length shorter than that of the first wire group; and a sealer covering the at least one semiconductor chip set, the first wire group, and the second wire group.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferred embodiments of the present invention will be described below with reference to FIGS. 1 to 21.

First, a general configuration of a semiconductor device 700 according to a first embodiment of the present invention will be described with reference to FIGS. 1 and 2.

Figure 1:
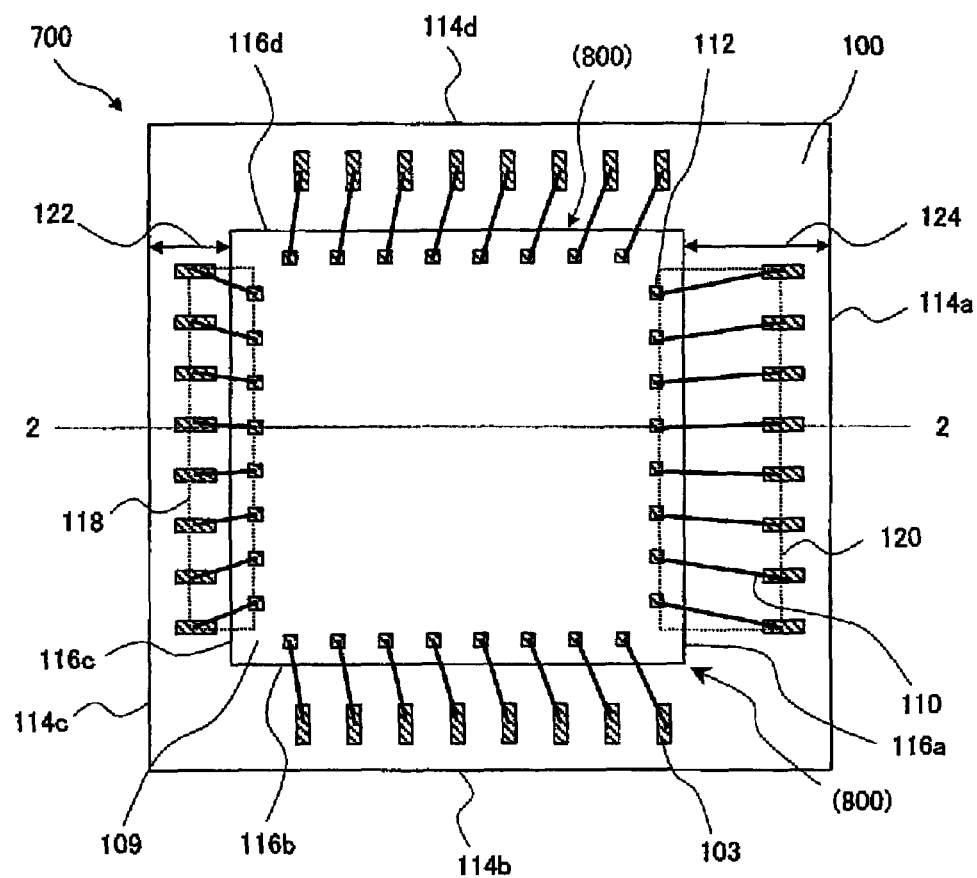
FIG. 1 is a plan view (top view) showing a semiconductor device, in which a sealer is illustrated as being transparent.
Figure 2:
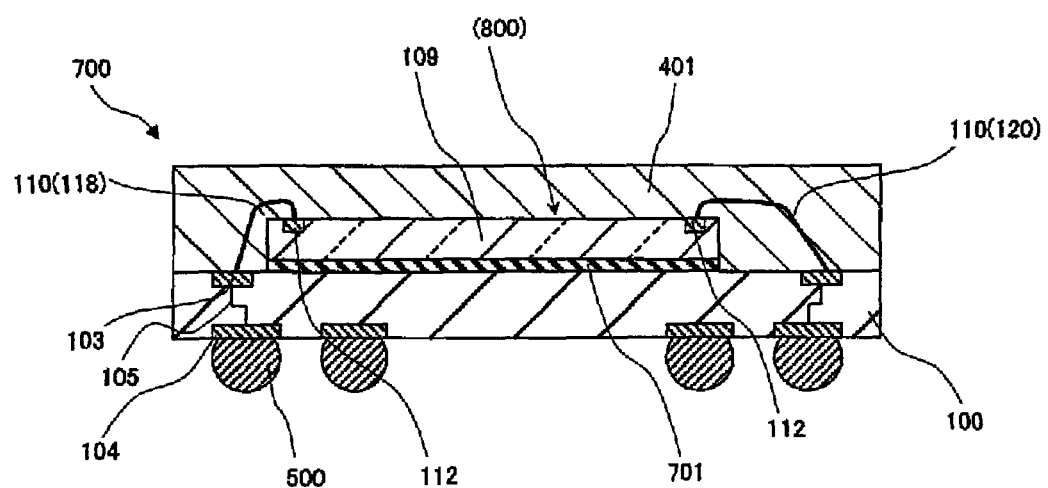
FIG. 2 is a cross-sectional view taken along line 2-2 of FIG. 1.

As shown in FIGS. 1 and 2, the semiconductor device 700 comprises a substrate 100 in the form of a plate and a semiconductor chip 109 mounted on one surface of the substrate 100 via an adhesive portion 701, such as an adhesive agent or a die attached film (DAF). The substrate 100 has a polygonal shape (a rectangular shape herein) on the plane. The semiconductor chip 109 has a polygonal shape (a rectangular shape herein) on the plane.

The semiconductor chip 109 comprises a logical circuit such as a microprocessor or a memory circuit such as a static random access memory (SRAM) or a dynamic random access memory (DRAM) formed on a substrate such as silicon or germanium. The semiconductor chip 109 includes electrode pads 112 on its front face, which is opposite to the adhesive surface.

A passivation film (not shown) is formed on the front face of the semiconductor chip 109 except the electrode pads 112. Thus, the surface on which the circuits have been formed is protected.

In FIG. 1, only one semiconductor chip 109 is mounted on the substrate 100. This single semiconductor chip 109 constitutes a semiconductor chip set 800. Nevertheless, the semiconductor device may include a plurality of chips as described later.

The substrate 100 includes connection pads 103 provided on a surface thereof on which the semiconductor chip 109 is mounted, lands 104 provided on another surface thereof, and internal wiring lines 105 for connecting the connection pads 103 and the lands 104 to each other.

For example, the substrate 100 is formed of a glass epoxy substrate.

Solder balls 500 are formed as external terminals (bump electrodes) on the lands 104 connecting the semiconductor device 700 to other devices. The connection pads 103 are electrically connected to the electrode pads 112 by wires 110.

Specifically, the semiconductor chip 109 is connected to the solder balls 500 via the electrode pads 112, the wires 110, the connection pads 103, the internal wiring lines 105, and the lands 104.

A wiring pattern (not shown) is formed on the surface of the substrate 100. Areas other than those comprising the connection pads 103 and the lands 104 are covered with an insulating film (not shown), such as a solder resist.

Furthermore, the semiconductor device 700 is provided with a sealer 401 so that the sealer 401 covers at least the semiconductor chip 109, the connection pads 103, the electrode pads 112, and the wires 110.

The sealer 401 is formed of a thermosetting resin having insulating properties, such as an epoxy resin. The sealer 401 serves to protect the semiconductor chip 109 and the electrically connected portions such as the connection pads 103, the electrode pads 112, and the wires 110.

The shapes and arrangements of the wires 110, the substrate 100, and the semiconductor chip 109 will be described below.

As described above, the semiconductor chip 109 has a rectangular shape on the plane. As shown in FIG. 1, the semiconductor chip 109 has a side 116a (first side), a side 116b, a side 116c (second side), and a side 116d.

Furthermore, the substrate 100 also has a rectangular shape on the plane. As shown in FIG. 1, the substrate 100 has a side 114a (third side), a side 114b, a side 114c (fourth side), and a side 114d.

The electrode pads 112 are arranged along the sides 116a, 116b, 116c, and 116d. The connection pads 103 are also arranged along the sides 114a, 114b, 114c, and 114d.

The wires 110 are provided so as to stride across the sides 116a, 116b, 116c, and 116d, respectively.

A first wire group 120 and a second wire group 118 are provided so as to respectively stride across the sides 116a and 116c, which are opposed to each other. The wire length of the second wire group 118 is shorter than that of the first wire group 120.

Thus, the wires striding across one of the opposing sides are shortened as compared to the wires striding across the other side. A wire sweep or a wire short circuit due to an injected resin can be prevented when a resin is injected from the side of the long wires toward the side of the short wires, the details of which will be described later.

Meanwhile, the sides 116a, 116b, 116c, and 116d of the semiconductor chip 109 are provided so as to correspond to the sides 114a, 114b, 114c, and 114d of the substrate 100, respectively. The shortest distance 122 between the side 114c and the side 116c is shorter than the shortest distance 124 between the side 114a and the side 116a.

When the semiconductor chip 109 is located at such a position, the wire length of the second wire group 118 can be made shorter than that of the first wire group 120.

The semiconductor device 700 has a general configuration as described above.

Next, a method of manufacturing the semiconductor device 700 will be described below with reference to FIGS. 1 to 15.

Figure 3:
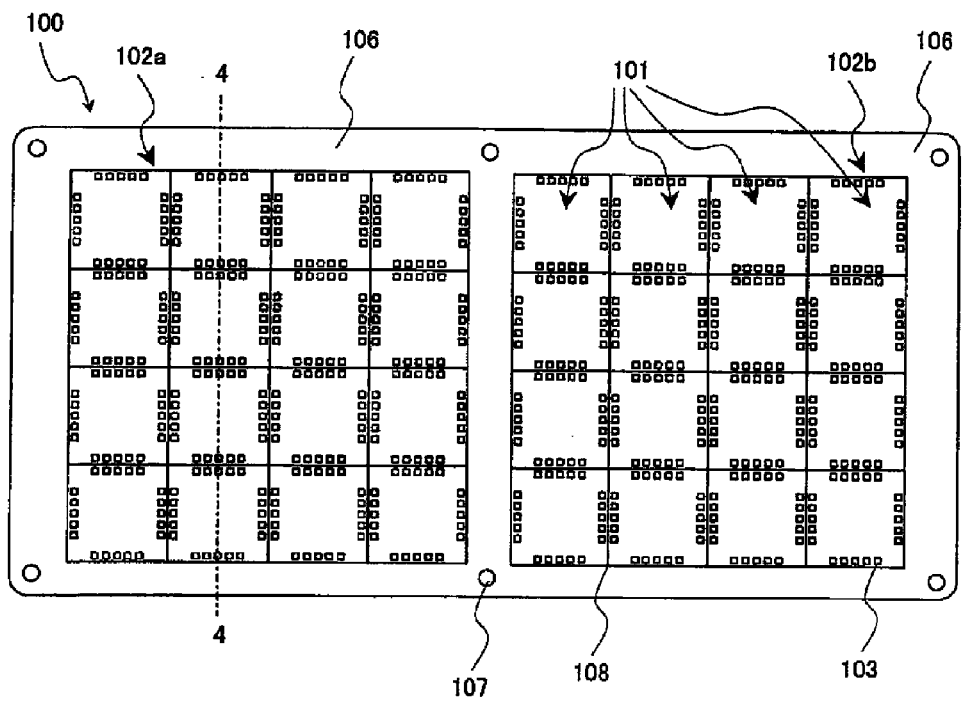
FIG. 3 is a diagram showing a general configuration of a substrate manufacturing a semiconductor device.
Figure 4:
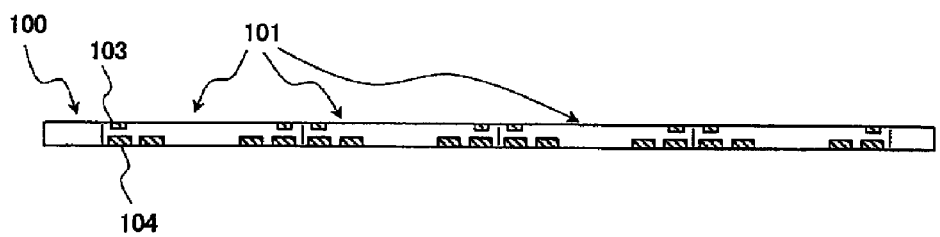
FIG. 4 is a cross-sectional view taken along line 4-4 of FIG. 3.
Figure 5:
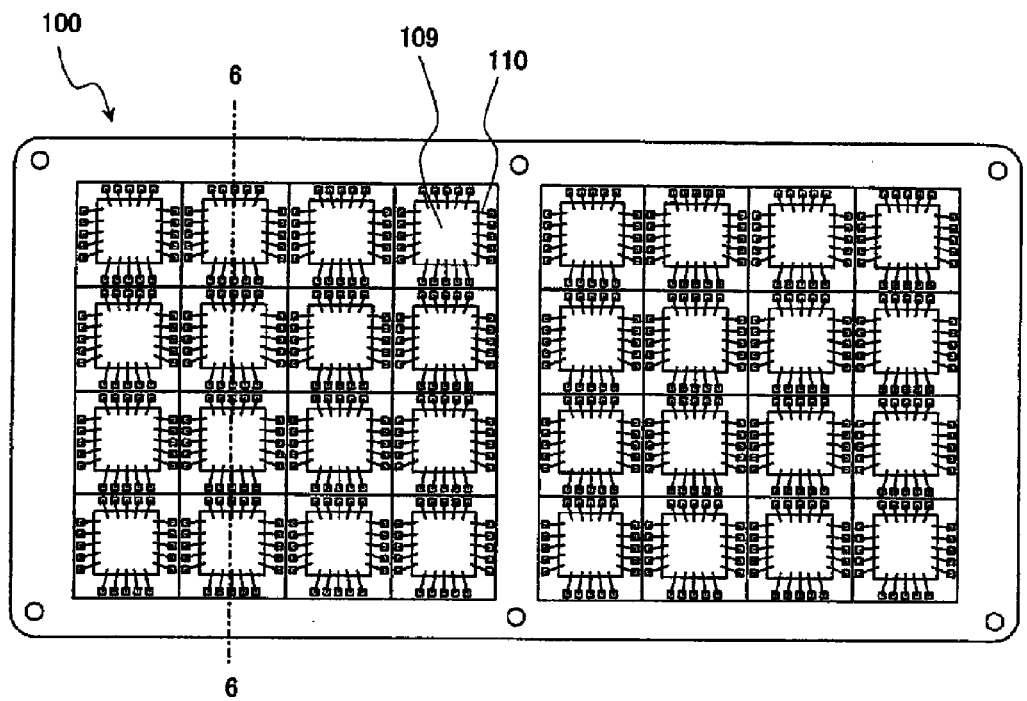
FIG. 5 is a plan view explanatory of a wire bonding process.
Figure 6:
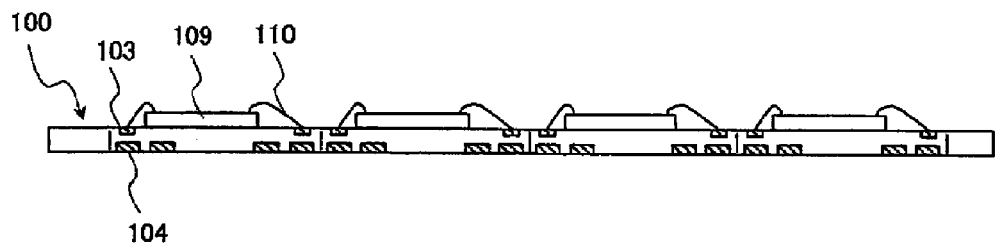
FIG. 6 is a cross-sectional view taken along line 6-6 of FIG. 5.

First, a substrate 100 as shown in FIGS. 3 and 4 is prepared.

As shown in FIGS. 3 and 4, for example, the substrate 100 is formed of a glass epoxy substrate having a thickness of 0.2 mm. As shown in FIG. 3, the substrate 100 has a plurality of product formation portions 101 arranged in the form of a matrix. For example, the product formation portions 101 arranged in the form of a matrix includes two 4×4 areas 102a and 102b, each of which includes 16 product formation portions. Each of the product formation portions 101 corresponds to one substrate 100 of the semiconductor device 700 shown in FIGS. 1 and 2. The aforementioned connection pads 103, lands 104, and internal wiring lines 105 (not shown in FIG. 3 or 4) are formed on each of the product formation portions 101.

Furthermore, a frame portion 106 is formed around the areas 102a and 102b, in which the product formation portions 101 are formed in the form of a matrix. Positioning holes 107 are formed in the frame portion 106 at predetermined intervals for conveyance and positioning. Dicing lines 108 are formed between the product formation portions 101.

Next, semiconductor chips 109 are mounted on the substrate 100.

Specifically, the substrate 100 is placed on a die bonding apparatus (not shown) in a state in which the connection pads 103 face upward.

After the substrate 100 has been placed on the apparatus, the semiconductor chips 109 are mounted on the adhesive portion 701 by using the die bonding apparatus (not shown). Then the adhesive portion 701 is hardened by heating or the like. Thus, die bonding is completed.

The semiconductor chips 109 are placed into such positions that the shortest distance 122 between the side 114c and the side 116c is shorter than the shortest distance 124 between the side 114a and the side 116a.

After the semiconductor chips 109 have been mounted on the substrate 100, the substrate 100 is placed on a wire bonding apparatus (not shown).

After the substrate 100 has been placed on the apparatus, ends of the wires 110 are connected to the electrode pads 112 (see FIG. 1) with the wire bonding apparatus (not shown) by ultrasonic thermocompression bonding. Then other ends of the wires 110 are connected to the connection pads 103 by ultrasonic thermocompression bonding so that the wires are curved into predetermined loop shapes (see FIGS. 5 and 6).

At that time, the wires 110 are connected so that the wire length of the second wire groups 118 is shorter than that of the first wire groups 120 (see FIGS. 1 and 2).

Next, the substrate 100 on which the semiconductor chips 109 have been mounted is placed on a molding apparatus 300.

Figure 7:
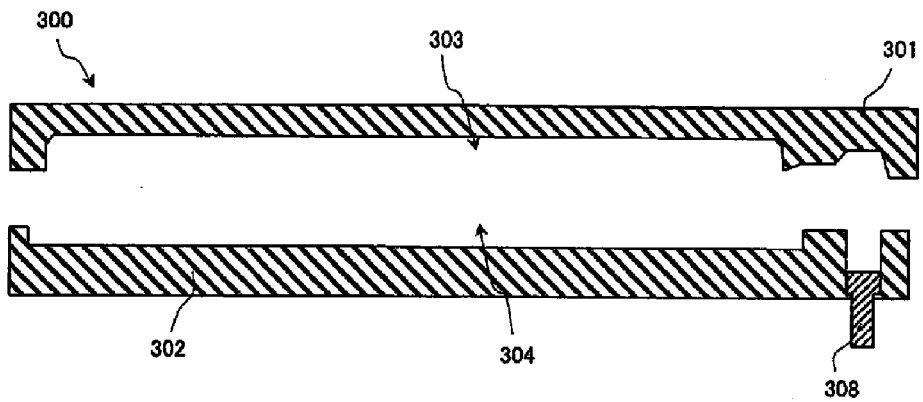
FIG. 7 is a cross-sectional view showing a general configuration of a molding apparatus (transfer molding apparatus) sealing a semiconductor device.

As shown in FIG. 7, the molding apparatus 300 has a metal mold tool including an upper mold 301 and a lower mold 302. The upper mold 301 comprises a cavity 303 formed in a surface facing the lower mold 302. The lower mold 302 comprises a recessed portion 304 formed in a surface facing the upper mold 301. The substrate 100 is mounted on the recessed portion 304 of the lower mold 302.

Figure 8:
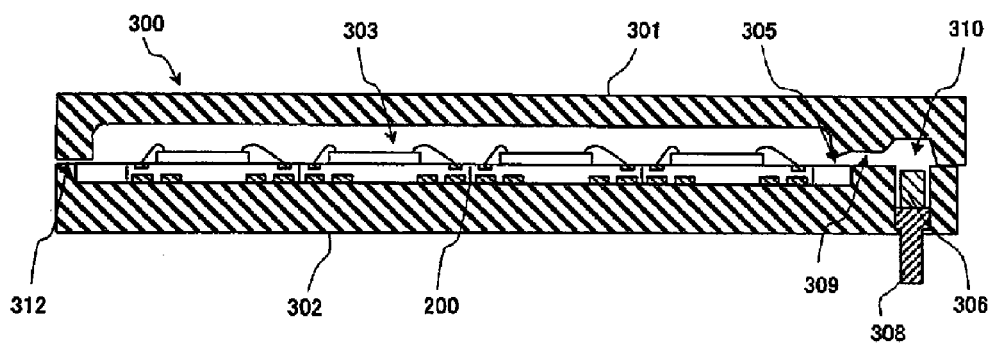
FIG. 8 is a cross-sectional view explanatory of a sealing process.

As shown in FIG. 8, the substrate 100 that has been subjected to wire bonding (see FIG. 5) is placed within the recessed portion 304 of the lower mold 302 (see FIG. 7).

At that time, the substrate 100 is arranged such that the second wire groups 118 are located near air vents 312 while the first wire groups 120 are located near gates 305.

Subsequently, as shown in FIG. 8, the substrate 100 is sealed by the upper mold 301 and the lower mold 302. Since the present embodiment employs a MAP method, the cavity 303 has such a size as to cover all of the product formation portions 101 in the lump. In the present embodiment, the cavity 303 is divided into two areas corresponding to the areas 102a and 102b. Then a tablet 306 (resin tablet) is supplied into a pot of the lower mold 302 and melted by heating.

Figure 9:
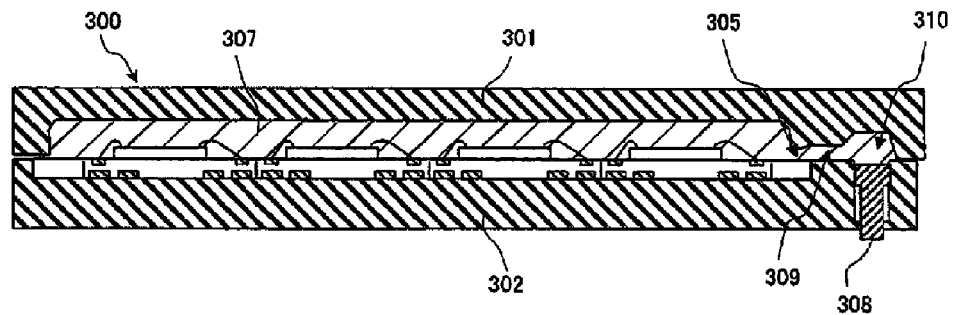
FIG. 9 is a cross-sectional view explanatory of the sealing process.

Next, as shown in FIG. 9, the molten sealing resin 307 is injected into the cavity 303 (see FIG. 8) through the gates 305 with a plunger 308.

At that time, the molten sealing resin 307 is injected from the first wire groups 120 toward the second wire groups 118, i.e., from the side of the long wires toward the side of the short wires. Therefore, it is possible to prevent a wire sweep and a wire short circuit, which would be caused by the injected resin.

When the sealing resin 307 is injected, the resin is filled so as to spread laterally due to the wires 110 near the gates 305. Therefore, the sealing resin 307 can be injected from the gates 305 without any wire short circuit even though the wire groups of long wires are located near the gates 305.

After the cavity 303 has been filled with the sealing resin, curing is conducted at a predetermined temperature, e.g., at 180° C. Thus, the sealing resin 307 is hardened so as to form a sealer 401 (see FIG. 2).

Then the substrate 100 is removed from the molding apparatus 300 (metal mold tool). A reflow process is performed at a predetermined temperature, e.g., at 240° C. As a result, the sealer 401 is completely hardened.

Figure 10:
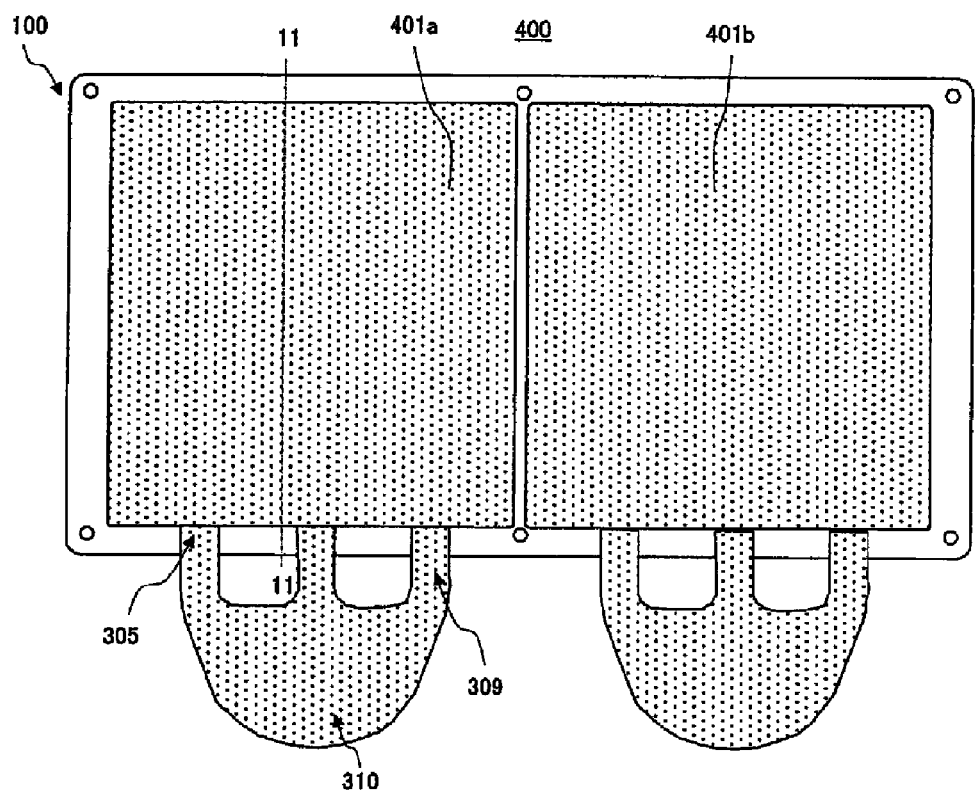
FIG. 10 is a plan view showing an intermediate structure.
Figure 11:
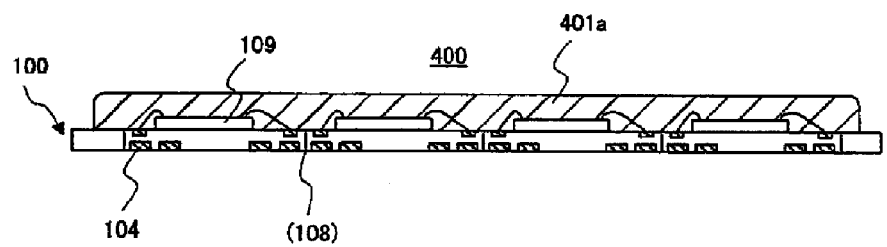
FIG. 11 is a cross-sectional view taken along line 11-11 of FIG. 10.

Thus, as shown in FIGS. 10 and 11, there is formed an intermediate structure 400 of a semiconductor device in which two sealers 401a and 401b are respectively formed in the two areas 102a and 102b of the product formation portions 101 on the substrate 100 (see FIG. 3). Furthermore, the sealing resin 307 is removed from the gates 305, runners 309, and culls 310, which are connected to the sealers 401a and 401b of the intermediate structure 400.

Figure 12:
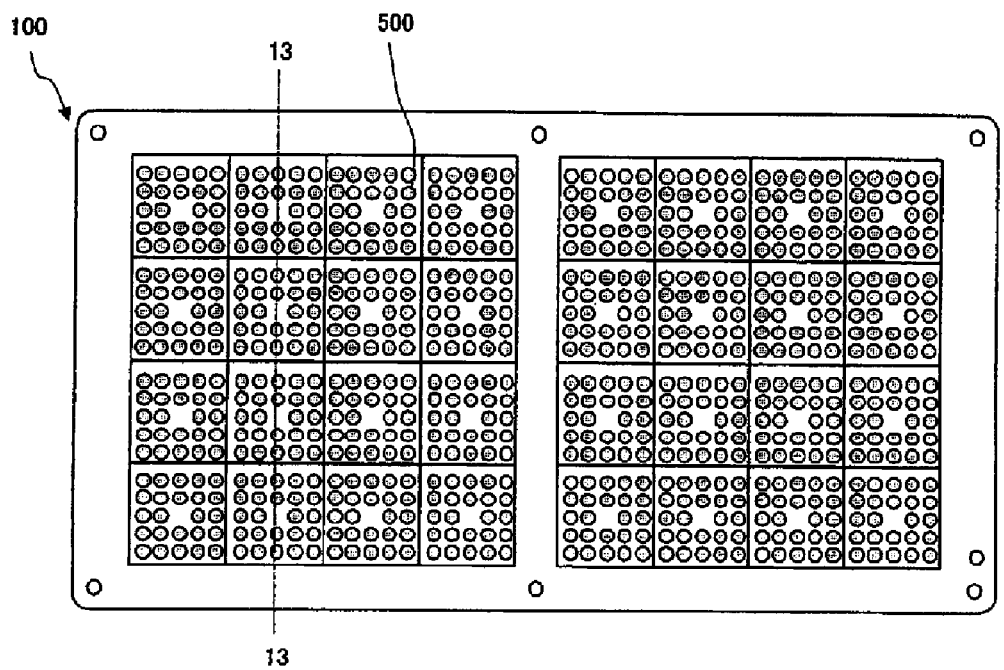
FIG. 12 is a plan view explanatory of a ball mounting process.
Figure 13:
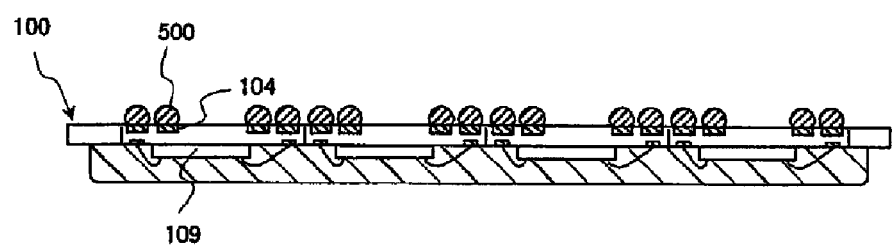
FIG. 13 is a cross-sectional view taken along line 13-13 of FIG. 12.

Next, as shown in FIGS. 12 and 13, solder balls 500 are mounted on the lands 104 of the substrate 100 so as to form bump electrodes, which serve as external terminals.

Specifically, a suction mechanism (not shown), which comprises a plurality of suction holes corresponding to the locations of the lands 104 on the substrate 100, is used to hold the solder balls 500 within the suction holes. The solder balls 500 being held are correctively mounted onto the lands 104 of the substrate 100 via flux.

After the solder balls 500 have been mounted on all of the product formation portions 101, a reflow process is performed on the substrate 100. Thus, bump electrodes (external terminals) are formed.

Next, the substrate 100 on which the solder balls 500 have been mounted is placed on a substrate dicing apparatus (not shown).

Figure 14:
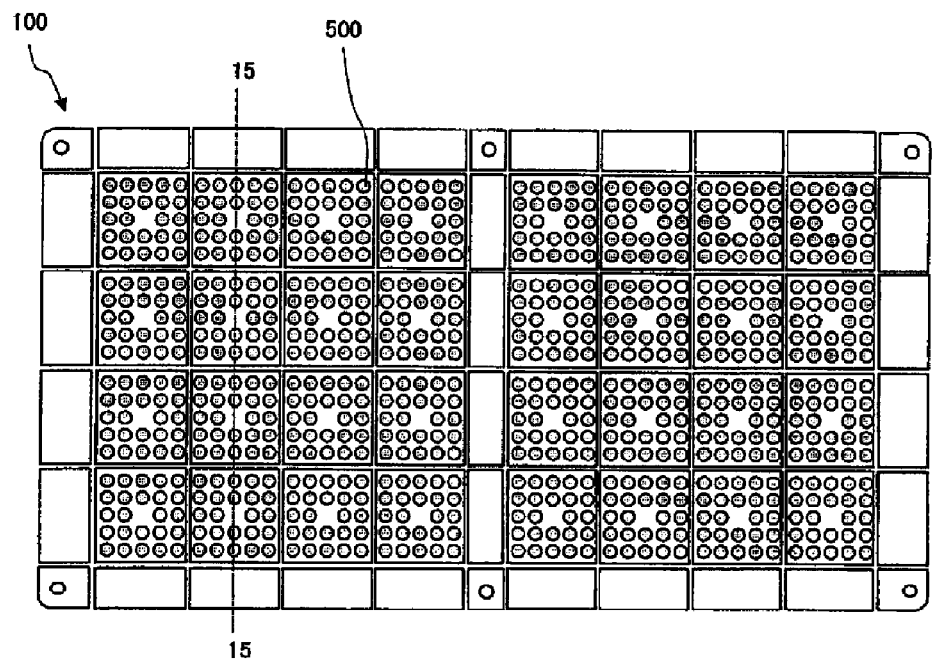
FIG. 14 is a plan view explanatory of a substrate dicing process.
Figure 15:
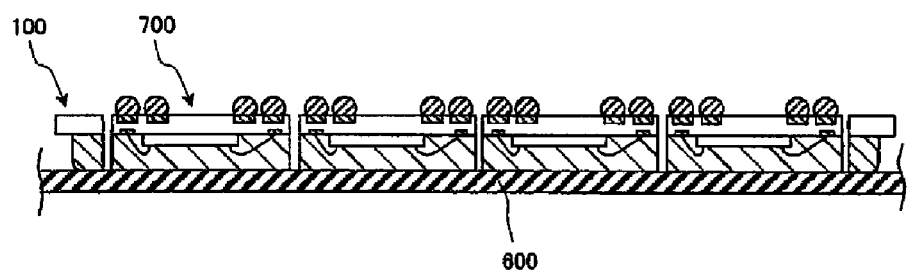
FIG. 15 is a cross-sectional view taken along line 15-15 of FIG. 14.

After the substrate 100 has been placed on the apparatus, the substrate 100 is cut along the dicing lines 108 (see FIG. 3) as shown in FIGS. 14 and 15. Thus, the product formation portions 101 (see FIG. 3) are individually separated from each other. Specifically, the sealers 401a and 401b of the substrate 100 are bonded to a dicing tape 600 via an adhesive layer (not shown) so that the dicing tape 600 supports the substrate 100. Subsequently, the substrate 100 is cut longitudinally and laterally along the dicing lines 108 by a dicing blade (not shown) of the dicing apparatus, so that the product formation portions 101 are individually cut and separated from each other. When an individual product formation portion 101 separated from other product formation portions 101 is picked up from the dicing tape 600, a semiconductor device 700 as shown in FIGS. 1 and 2 can be obtained.

Thus, according to the first embodiment, the semiconductor device 700 comprises the first wire group 120 and the second wire group 118 provided so as to respectively stride across the sides 116a and 116c of the semiconductor chip 109, which are opposed to each other. The wire length of the second wire group 118 is shorter than that of the first wire group 120. At the time of production, the sealer 401 is formed by injecting the sealing resin 307 from the side of the first wire group 120 toward the side of the second wire group 118.

Accordingly, a wire sweep and a wire short circuit can be prevented from occurring even if the flow rate of the sealing resin 307 is increased near the air vents 312 by entrainment of the sealing resin 307 when the sealing resin 307 is being injected.

Next, a second embodiment of the present invention will be described with reference to FIGS. 16 and 17.

In the second embodiment, a semiconductor chip set 800a is provided by mounting a plurality of semiconductor chips on the substrate of the first embodiment.

In the second embodiment, elements having the same function as in the first embodiment are denoted by the same reference numerals. The following description is focused on differences between the first embodiment and the second embodiment.

Figure 16:
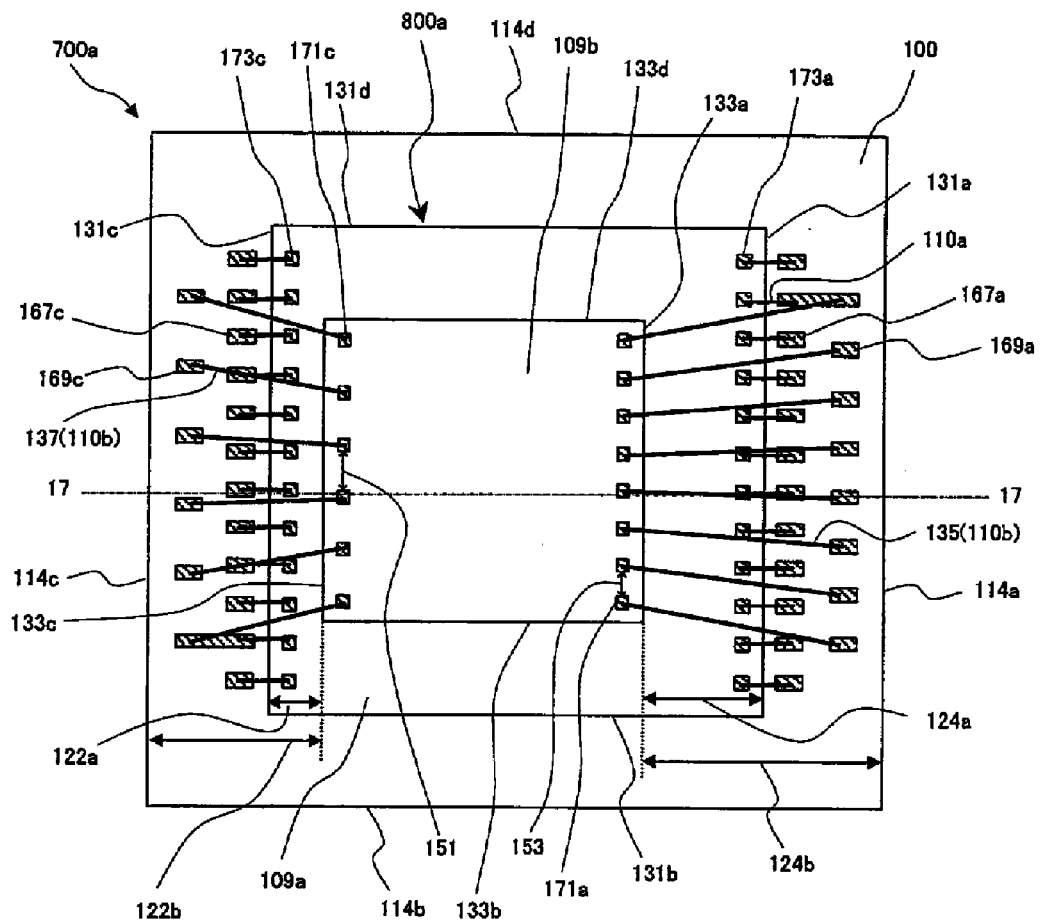
FIG. 16 is a plan view (top view) showing a semiconductor device according to another embodiment of the present invention, in which a sealer is illustrated as being transparent.
Figure 17:
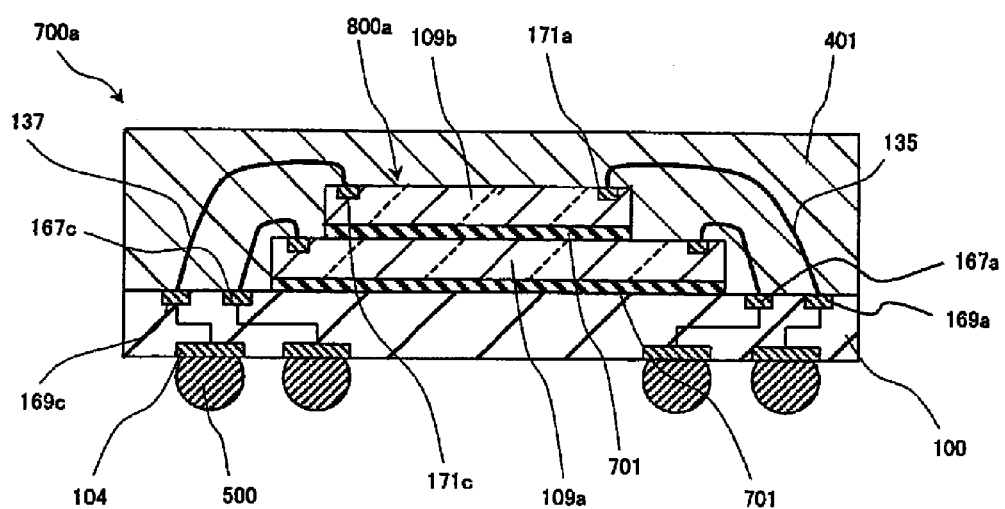
FIG. 17 is a cross-sectional view taken along line 17-17 of FIG. 16.

As shown in FIGS. 16 and 17, a semiconductor device 700a includes a substrate 100 and a lower semiconductor chip 109a mounted on the substrate 100.

The substrate 100 includes connection pads 167a and 167c arranged along the side 114a and the side 114c, respectively.

The substrate 100 also includes connection pads 169a and 169c arranged along the side 114a and the side 114c, respectively. The connection pads 169a and 169c are located outside of the connection pads 167a and 167c, respectively.

The lower semiconductor chip 109a has a rectangular shape on the plane with four sides 131a, 131b, 131c, and 131d.

Meanwhile, the lower semiconductor chip 109a includes electrode pads 173a and 173c arranged along the side 131a and the side 131c, respectively. The electrode pads 173a and 173c are connected to the connection pads 167a and 167c, respectively, by wires 110a.

An upper semiconductor chip 109b is stacked on the lower semiconductor chip 109a via an adhesive portion 701 such as a DAF. The lower semiconductor chip 109a and the upper semiconductor chip 109b constitute the semiconductor chip set 800a.

The size of the upper semiconductor chip 109b is smaller than that of the lower semiconductor chip 109a. The upper semiconductor chip 109b is arranged on the lower semiconductor chip 109a so that the electrode pads 173a and 173c of the lower semiconductor chip 109a are exposed.

The upper semiconductor chip 109b also has a rectangular shape on the plane with four sides 133a, 133b, 133c, and 133d, which correspond to the sides 131a, 131b, 131c, and 131d of the lower semiconductor chip 109a, respectively.

Furthermore, the upper semiconductor chip 109b includes electrode pads 171a and 171c arranged along the side 133a (first side) and the side 133c (second side), respectively.

The electrode pads 171a and 171c are arranged such that intervals 151 between the electrode pads 171c are greater than intervals 153 between the electrode pads 171a.

The electrode pads 171a are connected to the connection pads 169a by a first wire group 135. The electrode pads 171c are connected to the connection pads 169c by a second wire group 137. Thus, the wire intervals of the second wire group 137 are greater than the wire intervals of the first wire group 135.

Since the intervals 151 between the electrode pads 171c are greater than the intervals 153 between the electrode pads 171a, the wire intervals of the second wire group 137 become greater than the wire intervals of the first wire group 135. Therefore, a wire short circuit is less likely to occur.

Furthermore, the shortest distance 122b between the side 133c of the upper semiconductor chip 109b and the side 114c of the substrate 100 is shorter than the shortest distance 124b between the side 133a of the upper semiconductor chip 109b and the side 114a of the substrate 100. Moreover, the shortest distance 122a between the side 133c of the upper semiconductor chip 109b and the side 131c of the lower semiconductor chip 109a is shorter than the shortest distance 124a between the side 133a of the upper semiconductor chip 109b and the side 131a of the lower semiconductor chip 109a.

With such an arrangement, the wire length of the second wire group 137 can be made shorter than that of the first wire group 135 as with the first embodiment.

Meanwhile, the wire length of the wires 110a of the lower semiconductor chip 109a is shorter than that of wires 110b of the upper semiconductor chip 109b. Therefore, the wires 110a of the lower semiconductor chip 109a have less risk of a wire short circuit as compared to the wires 110b of the upper semiconductor chip 109b. Accordingly, the wires 110a of the lower semiconductor chip 109a are configured to have an equal wire length.

In the second embodiment, when the sealing resin 307 is to be injected, an injection direction of the sealing resin 307 is selected in consideration of the arrangement of the wires 110b of the upper semiconductor chip 109b, which is likely to be influenced by the risk of a wire short circuit.

Specifically, when the sealing resin 307 is to be injected, the substrate 100 is set on the molding apparatus 300 so that the second wire group 137 faces the air vents 312 while the first wire group 135 faces the gates 305. The sealing resin 307 is injected from the side of the first wire group 135 toward the side of the second wire group 137.

Thus, even in a case of a multi-chip package (MCP) type semiconductor device 700a having a plurality of semiconductor chips mounted thereon, a wire sweep and a wire short circuit can be prevented from occurring without an increase of the size of the semiconductor device 700a if the flow rate of the sealing resin 307 is increased near the air vents 312 by entrainment of the sealing resin 307 when the sealing resin 307 is being injected, as with the first embodiment.

Furthermore, when the sealing resin 307 is injected, the sealing resin 307 is filled so as to spread laterally due to the wires near the gates 305. Therefore, by arranging the first wire group 135 of long wires near the gates 305 as with the first embodiment, the sealing resin 307 can be injected from the gates 305 without any wire short circuit even though the long wires are located near the gates 305.

Thus, according to the second embodiment, the semiconductor device 700a has the first wire group 135 and the second wire group 137 provided so as to respectively stride across the sides 133a and 133c of the upper semiconductor chip 109b, which are opposed to each other. The wire length of the second wire group 137 is shorter than that of the first wire group 135. At the time of production, the sealer 401 is formed by injecting the sealing resin 307 from the side of the first wire group 135 toward the side of the second wire group 137.

Accordingly, the same advantageous effects as in the first embodiment can be attained.

Furthermore, according to the second embodiment, the lower semiconductor chip 109a and the upper semiconductor chip 109b are stacked on the substrate 100 of the semiconductor device 700a. The lower semiconductor chip 109a and the upper semiconductor chip 109b constitute the semiconductor chip set 800a.

Therefore, the second embodiment is applicable to an MCP type semiconductor device.

Moreover, according to the second embodiment, the intervals 151 between the electrode pads 171c are greater than the intervals 153 between the electrode pads 171a. Accordingly, the intervals of the second wire group 137 become greater than the intervals of the first wire group 135.

As a result, a wire short circuit is less likely to occur as compared to the first embodiment.

Next, a semiconductor device 700b according to a third embodiment will be described below with reference to FIGS. 18 and 19.

In the third embodiment, the wire diameter of the wires 110c of the second wire group 118 is greater than that of the wires 110 of the first wire group 120 of the first embodiment.

In the third embodiment, elements having the same function as in the first embodiment are denoted by the same reference numerals, and the explanation thereof is omitted herein.

Figure 18:
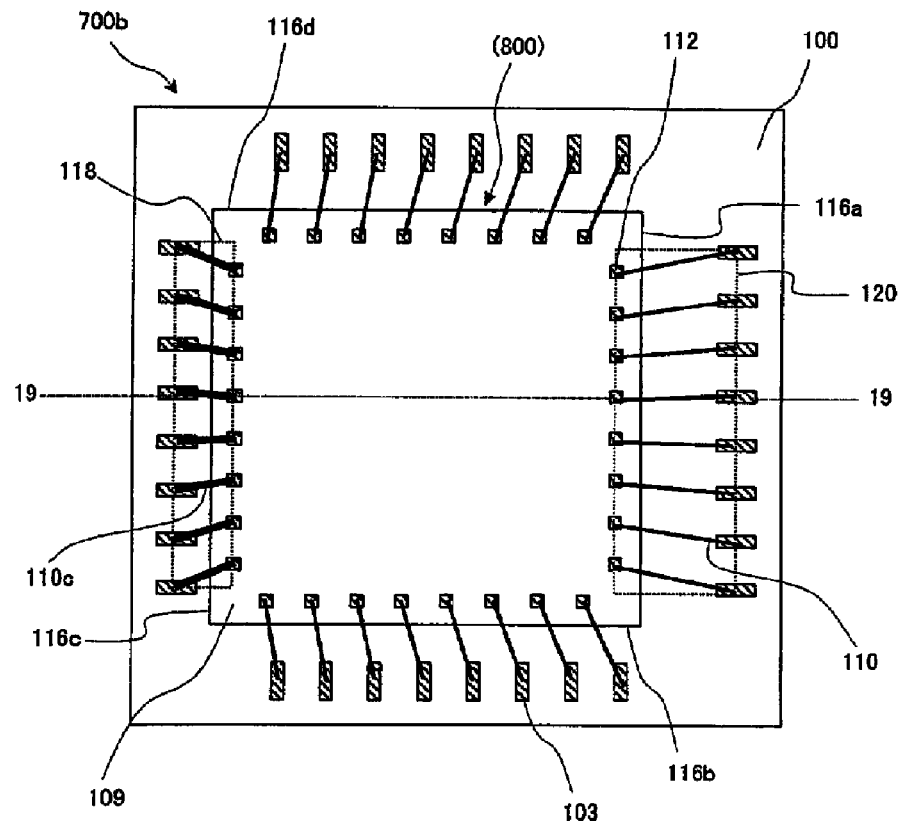
FIG. 18 is a plan view (top view) showing a semiconductor device according to still another embodiment of the present invention, in which a sealer is illustrated as being transparent.
Figure 19:
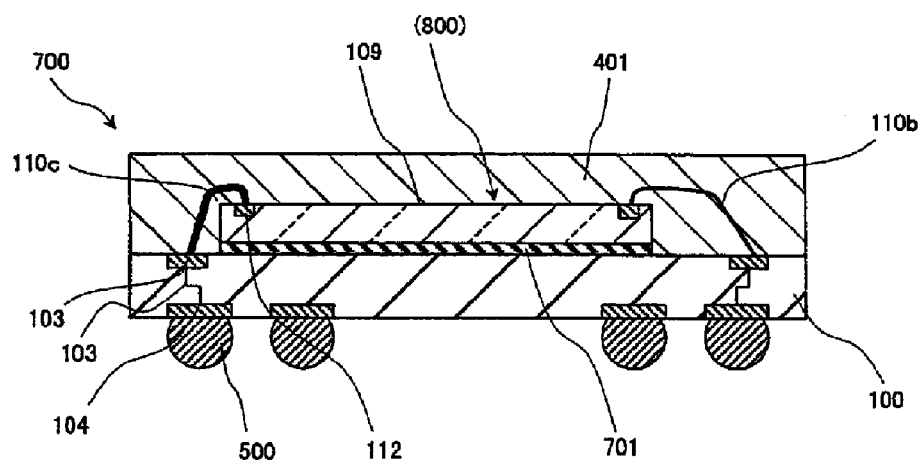
FIG. 19 is a cross-sectional view taken along line 19-19 of FIG. 18.

As shown in FIGS. 18 and 19, in the semiconductor device 700b, the wire diameter of the wires 110c of the second wire group 118 is greater than that of the wires 110 of the first wire group 120. In other words, wires having a wire diameter greater than the wires 110 are used for the wires 110c.

With this configuration, a wire short circuit is less likely to occur as compared to the case where the wires 110c have the same wire diameter as the wires 110.

Thus, according to the third embodiment, the semiconductor device 700b has the first wire group 120 and the second wire group 118 provided so as to respectively stride across the sides 116a and 116c of the semiconductor chip 109, which are opposed to each other. The wire length of the second wire group 118 is shorter than that of the first wire group 120. At the time of production, the sealer 401 is formed by injecting the sealing resin 307 from the side of the first wire group 120 toward the side of the second wire group 118.

Accordingly, the same advantageous effects as in the first embodiment can be attained.

Furthermore, according to the third embodiment, the wire diameter of the wires 110c of the second wire group 118 is greater than that of the wires 110 of the first wire group 120 in the semiconductor device 700b.

Therefore, a wire short circuit is less likely to occur as compared to the first embodiment.

Next, a semiconductor device 700c according to a fourth embodiment will be described below with reference to FIGS. 20 and 21.

In the fourth embodiment, wires are provided only on one side of the upper semiconductor chip 109b of the second embodiment.

In the fourth embodiment, elements having the same function as in the second embodiment are denoted by the same reference numerals, and the explanation thereof is omitted herein.

Figure 20:
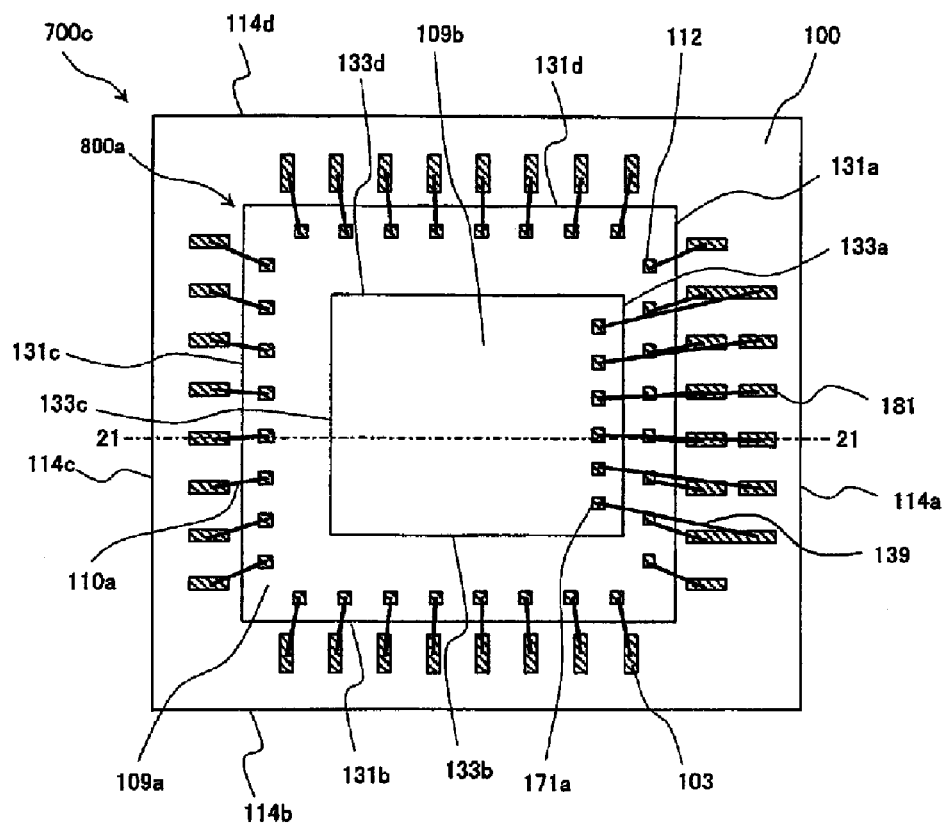
FIG. 20 is a plan view (top view) showing a semiconductor device according to still another embodiment of the present invention, in which a sealer is illustrated as being transparent.
Figure 21:
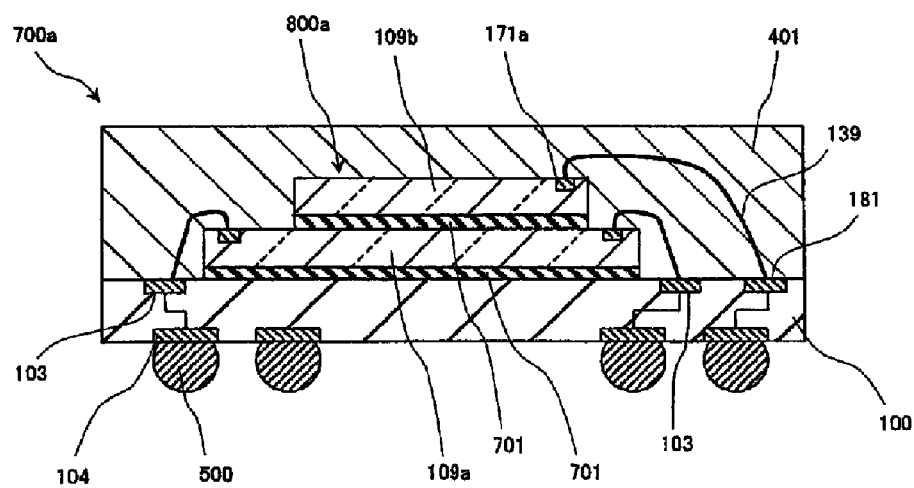
FIG. 21 is a cross-sectional view taken along line 21-21 of FIG. 20.

As shown in FIGS. 20 and 21, the electrode pads 171a are provided only along the side 133a of the upper semiconductor chip 109b in the semiconductor device 700c. Wires 139 are connected to the electrode pads 171a so as to stride across the side 133a.

Meanwhile, the substrate 100 includes connection pads 103 arranged along the side 114a, 114b, 114c, and 114d and connection pads 181 arranged only along the side 114a. The connection pads 181 are located outside of the connection pads 103.

The connection pads 103 are connected to the electrode pads 112 of the lower semiconductor chip 109a via the wires 110a. The connection pads 181 are connected to the electrode pads 171a by the wires 139.

Thus, the wires 139 may be provided only on one side of the upper semiconductor chip 109b.

In this case, the wires 139 correspond to the first wire group. Some of the wires 110a provided on the lower semiconductor chip 109a that stride across the side 131c, which is located on an opposite side of the side 133c to the side 133a, correspond to the second wire group.

In this case, the semiconductor device 700c is placed on the molding apparatus 300 so that the wires 139 (the side 133a) face the gates 305 while the side 131c faces the air vents 312. The sealer 401 is formed by injecting the sealing resin 307 from the side of the wires 139 toward the side 131c.

Thus, according to the fourth embodiment, the semiconductor device 700c includes the wires 139 provided so as to stride across the side 133a of the upper semiconductor chip 109b. At the time of production, the sealer 401 is formed by injecting the sealing resin 307 from the side of the wires 139.

Accordingly, the same advantageous effects as in the first embodiment can be attained.

Furthermore, according to the fourth embodiment, the wires 139 are provided only on one side of the semiconductor device 700c.

Therefore, advantageous effects equivalent to or higher than those of the second embodiment can be attained.

Although the inventions has been described above in connection with several preferred embodiments thereof, it will be appreciated by those skilled in the art that those embodiments are provided solely for illustrating the invention, and should not be relied upon to construe the appended claims in a limiting sense.

For example, in the above embodiments, the present invention is applied to a semiconductor device comprising one or two semiconductor chips mounted on a substrate. Nevertheless, the present invention is also applicable to any semiconductor device having different wire lengths, such as a semiconductor device comprising three or more semiconductor chips stacked thereon.

Furthermore, in the above embodiments, the substrate is formed of a glass epoxy substrate. Nevertheless, the substrate may be formed of a ceramic substrate. Alternatively, a flexible substrate formed of a polyimide substrate may be used instead.

What is claimed is:

1. A semiconductor device comprising:
    a substrate defined by a first side and second side opposite the first side;
    a first semiconductor chip defined by a third side and a fourth side opposite the third side, the first semiconductor chip being mounted over the substrate so the third and fourth sides face the first and second sides, respectively;
    a second semiconductor chip defined by a fifth side and a sixth side opposite the fifth side, the second semiconductor chip being stacked over the first semiconductor chip so that a distance between the second side and the sixth side is shorter than a distance between the first side and the fifth side;
    a plurality of first wires electrically coupling the substrate to the second semiconductor chip and extending across the fifth side without contacting the first semiconductor chip;
    a plurality of second wires electrically coupling the substrate to the second semiconductor chip and extending across the sixth side, each of the second wires being shorter than the first wires;
    a plurality of third wires electrically coupling the substrate to the first semiconductor chip and extending across the third side, each of the third wires being shorter than the first and second wires;
    a plurality of fourth wires electrically coupling the substrate to the first semiconductor chip and extending across the fourth side, each of the fourth wires being shorter than the first and second wires, and wherein the plurality of fourth wires is greater in number than the plurality of second wires;
    a sealing resin covering the first semiconductor chip, the second semiconductor chip, the first wires, the second wires, the third wires, and the fourth wires.

2. The semiconductor device as recited in claim 1, wherein an interval of the second wires is greater than an interval of the first wires.

3. The semiconductor device as recited in claim 1, wherein the second wires have a wire diameter greater than that of the first wires.

4. The semiconductor device as recited in claim 1, further comprising:
    an external electrode provided on a surface of the substrate opposite to a surface on which the first and second semiconductor chips are mounted.

5. The semiconductor device as recited in claim 1, wherein each of the fourth wires has substantially a same length as the third wires.

6. The semiconductor device as recited in claim 1, wherein the plurality of first wires is greater in number than the plurality of second wires.

7. The semiconductor device as recited in claim 1, wherein the second wires electrically couple the substrate to the second semiconductor chip without contacting the first semiconductor chip.

8. The semiconductor device as recited in claim 1, wherein the plurality of third wires are greater in number than the plurality of first wires.

9. A semiconductor device comprising:
    a wiring substrate defined by a first side and a second side opposite to the first side;

a semiconductor chip defined by a third side and a fourth side opposite to the third side, the semiconductor chip including a plurality of first electrodes formed along the third side and a plurality of second electrodes formed along the fourth side, the number of the second electrodes is greater than that of the first electrodes, and the semiconductor chip mounted over the wiring substrate so that a distance between the third side and the first side of the wiring substrate is shorter than a distance between the fourth side and the second side of the wiring substrate;

a plurality of first wires electrically coupling the first electrodes of the semiconductor chip to the wiring substrate;

a plurality of second wires electrically coupling the second electrodes of the semiconductor chip to the wiring substrate;

an another semiconductor chip sandwiched between the wiring substrate and the semiconductor chip; and a plurality of third wires electrically coupling the another semiconductor chip to the wiring board, each of the third wires is shorter than any one of the first and second wires.

10. The semiconductor device as claimed in claim 9, wherein each of the second wires is longer than any one of the first wires.

11. The semiconductor device as claimed in claim 9, further comprising:

a sealing resin formed over the wiring substrate to cover the semiconductor chip, the plurality of first wires, and the plurality of second wires.

12. The semiconductor device as claimed in claim 9, wherein an interval between a closest two of the first wires is greater than that of the second wires.

13. The semiconductor device as claimed in claim 9, wherein a diameter of the first wires is greater than that of the second wires.

14. The semiconductor device as claimed in claim 9, wherein a distance between a closest two electrodes of the first electrodes is greater than a distance between a closest two electrodes of the second electrodes.

15. A semiconductor device comprising:

a substrate including a plurality of connection pads thereon;

a first semiconductor chip mounted over the substrate, the first semiconductor chip defined by a first side and a second side opposite to the first side;

a second semiconductor chip defined by a third side and a fourth side opposite to the third side, a distance between the third side and the fourth side of the second semiconductor chip is shorter than a distance between the first side and the second side of the first semiconductor chip, the second semiconductor chip stacked over the first semiconductor chip so that a distance between the third side and the first side of the first semiconductor chip is shorter than a distance between the fourth side and the second side of the first semiconductor chip, the first semiconductor chip being between the substrate and the second semiconductor chip, the second semiconductor chip including a plurality of first electrodes formed along the third side thereof and a plurality of second electrodes formed along the fourth side thereof;

a plurality of first wires electrically coupling the first electrodes to the connection pads;

a plurality of second wires electrically coupling the second electrodes to the connection pads without contacting the first semiconductor chip, each of the second wires is longer than any one of the first wires; and a sealing resin formed over the substrate to cover the first semiconductor chip, the second semiconductor chip, the first wires and the second wires.

16. The semiconductor device as claimed in claim 15, wherein the first semiconductor chip includes a plurality of third electrodes thereon, the third electrodes being electrically coupled the connection pads with a plurality of third wires, and each of the third wires is shorter than any one of the first and second wires.

17. The semiconductor device as claimed in claim 16, wherein the second wires include first ends that are in contact with the connection pads, second ends that are in contact with the second electrodes, and intermediate parts joined between the first and second ends, the intermediate parts being continuously constructed with substantially same diameter between the first and second ends.

18. The semiconductor device as claimed in claim 15, wherein the number of the second electrodes is greater than that of the first electrodes.

19. The semiconductor device as claimed in claim 15, wherein an interval between a closest two of the first wires is greater than that of the second wires.

20. The semiconductor device as claimed in claim 15, wherein a distance between a closest two electrodes of the first electrodes is greater than a distance between a closest two electrodes of the second electrodes.

21. The semiconductor device as claimed in claim 1, wherein the substrate includes a connection pad thereof, the second semiconductor chip includes an electrode thereof, and the first wires include a first end that is in contact with the connection pad, a second end that is in contact with the electrode, and an intermediate part joined between the first and second ends, the intermediate part being continuously constructed with substantially same diameter between the first and second ends.

* * * * *